US006730575B2

(12) United States Patent
Eldridge (10) Patent No.: US 6,730,575 B2
(45) Date of Patent: May 4, 2004

(54) METHODS OF FORMING PEROVSKITE-TYPE MATERIAL AND CAPACITOR DIELECTRIC HAVING PEROVSKITE-TYPE CRYSTALLINE STRUCTURE

(75) Inventor: Jerome M. Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/945,137

(22) Filed: Aug. 30, 2001

(65) Prior Publication Data

US 2003/0045022 A1 Mar. 6, 2003

(51) Int. Cl.[7] ............................................. H01L 21/20
(52) U.S. Cl. ........................ 438/396; 438/3; 438/240
(58) Field of Search ................... 438/396, 520, 438/592, 653, 660, 608, 622, 661, 663, 240, 785

(56) References Cited

U.S. PATENT DOCUMENTS

| | | | | |
|---|---|---|---|---|
| 5,142,437 A | * | 8/1992 | Kammerdiner et al. | 361/321.1 |
| 5,272,341 A | * | 12/1993 | Micheli et al. | 250/338.3 |
| 5,350,738 A | | 9/1994 | Hase et al. | |
| 5,789,267 A | * | 8/1998 | Hsia et al. | 438/240 |
| 5,953,619 A | * | 9/1999 | Miyazawa et al. | 438/396 |
| 6,025,257 A | * | 2/2000 | Jeon | 438/608 |
| 6,403,441 B1 | * | 6/2002 | Takehiro et al. | 438/396 |
| 6,461,931 B1 | * | 10/2002 | Eldridge | 438/398 |

FOREIGN PATENT DOCUMENTS

EP      0727832 A1 * 8/1996

OTHER PUBLICATIONS

U.S. patent application Ser. No. 09/651,380, Eldridge, filed Aug. 29, 2000.
John Baliga, "New Materials Enhance Memory Performance", Semiconductor International, Nov. 1999, pp. 1–8.
"Advances in Ultrathin Oxides and Oxynitrides I", Materials Research Society Proceedings Series, vol. 567, Apr. 5, 1999, 2 pages.
K.S. Tang, W.S. Lau, and G.S. Samudra, "Trends in Dram Dielectrics", IEEE Circuits & Devices, vol. 13, No. 3, May 1997, pp. 27–34.
D.W. Hess, "Plasma–assisted oxidation, anodization, and nitridation of silicon", IBM Journal of Research & Development, vol. 43, No. 1/2 Plasma processing, 22 pages. chemistry", Pergamon Press, 1958, pp. 226–227 and 336–337.

(List continued on next page.)

Primary Examiner—Amir Zarabian
Assistant Examiner—Khanh Duong
(74) Attorney, Agent, or Firm—Wells St. John P.S.

(57) ABSTRACT

A method includes forming a material over a substrate, oxidizing the material, and separately from the oxidizing, converting at least a portion of the oxidized material to a perovskite-type crystalline structure. The material can include an alloy material containing at least two metals. The method can further include retarding interdiffusion of the two metals. Such methods exhibit substantial advantage when at least two of the metals exhibit a substantial difference in chemical affinity for oxygen. A passivation layer against carbon and nitrogen reaction can be provided over the material. The passivation layer can be oxidized into a dielectric layer. The perovskite-type material can also be a dielectric layer.

49 Claims, 2 Drawing Sheets

OTHER PUBLICATIONS

Ting, Chen, Liu, "Structural evolution and Optical Properties of TiO$_2$ thin films prepared by thermal oxidation of sputtered Ti films", Journal of Applied Physics, vol. 88, No. 9, Oct. 15, 2000, pp. 4628–4633.

O. Kubaschewski, B.E. Hopkins, "Oxidation of Metals and Alloys", Butterworths, London, Second Edition, 1962, pp. 36–37 and 70–73.

F.P. Fehlner, "Low–Temperature Oxidation", Monograph published by Electrochemical Society, Pennington, New Jersey, 1983, pp. 31–35.

Richard A. Swalin, "Themodynanamics of Solids", Second Edition, Chapter 5, John Wiley & Sons, 1972, pp. 112–115.

* cited by examiner

METHODS OF FORMING PEROVSKITE-TYPE MATERIAL AND CAPACITOR DIELECTRIC HAVING PEROVSKITE-TYPE CRYSTALLINE STRUCTURE

TECHNICAL FIELD

The invention pertains to methods of forming materials having a perovskite-type crystalline structure, methods of forming capacitor dielectrics, capacitor dielectrics produced thereby, and capacitor constructions.

BACKGROUND OF THE INVENTION

An increasing need exists for reducing the size and increasing the performance of integrated circuit components, for example, dynamic random access memory (DRAM) and non-volatile field effect transistor (FET) memory, as well as other devices. One often common part of integrated circuit components includes dielectric material. Typically, using a dielectric material having a higher dielectric constant K in a capacitor allows storage of the same amount of electrical charge for a given thickness of dielectric with a reduced capacitor area. The increased capacity to store electrical charge provides for fabrication of more advanced transistors. Further, substitution of higher K dielectric can provide improved performance characteristics for a given device. Accordingly, a desire exists to produce higher K materials.

SUMMARY OF THE INVENTION

According to one aspect of the invention, a method includes forming a material over a substrate, oxidizing the material, and, separately from the oxidizing, converting at least a portion of the oxidized material to a perovskite-type crystalline structure. As an example, the material can include an alloy of at least two metals. The oxidizing can include exposure to an oxygen plasma and implanting oxygen ions into the material. The converting can include heating the oxidized material and reaching a maximum temperature no more than about one-half of a melting point temperature of the perovskite-type material. The method can further include forming a passivation layer to carbon and nitrogen over the material.

Another aspect of the invention includes forming an alloy material containing at least two metals over a substrate, retarding interdiffusion of the at least two metals, oxidizing the alloy material after retarding interdiffusion, and converting at least a portion of the oxidized alloy material to a perovskite-type crystalline structure. As an example, retarding interdiffusion can include oxidizing at least an outer portion of the alloy material and implanting ions into the outer portion. Also, oxidizing the outer portion and implanting can occur in situ with forming the alloy material. The substrate can include a capacitor electrode and the converted, oxidized alloy material can include a capacitor dielectric layer.

In a further aspect of the invention, a capacitor dielectric forming method includes forming an alloy layer comprising at least two metals over a capacitor electrode, oxidizing the alloy layer, and converting the alloy layer to form a perovskite-type crystalline structure. As an example, at least two of the metals can exhibit a substantial difference in chemical affinity for oxygen. Also, an additional alloy layer can be further converted to an additional capacitor dielectric layer including a perovskite-type crystalline structure.

In a still further aspect of the invention, a capacitor construction includes an inner electrode, an inner dielectric layer over the inner electrode, an outer dielectric layer over the inner dielectric layer, and an outer electrode over the outer dielectric layer. The inner dielectric layer can include an oxidized alloy of at least two metals in a perovskite-type crystalline structure. The outer dielectric layer can include an oxide of a material wherein the material exhibits passivation against carbon and nitrogen reaction. As an example, the capacitor construction can further include a middle dielectric layer between the inner and outer dielectric layers. The middle dielectric layer can include an oxidized alloy of at least two metals in a perovskite-type crystalline structure.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Perovskite-type materials are a class of crystalline, ceramic materials including metal oxides. They exhibit a wide range of chemical and physical properties and are accordingly of use in a variety of applications. For purposes of interpreting this disclosure and the claims that follow, a "perovskite-type material" is defined as any material substantially having a perovskite-type crystal structure, including perovskite itself ($CaTiO_3$), and other materials. The crystal structure is referred to as "substantially" a perovskite-type crystal structure to indicate that there can be distortions of the structure corresponding to a theoretically ideal perovskite-type crystal structure in many of the materials having perovskite-type crystal structures, including, for example perovskite itself.

One use for perovskite-type material is as a dielectric. However, the various aspects of the invention herein are not limited to dielectrics. Other uses for the perovskite-type materials and methods of formation described herein include gas permeable membranes, pressure sensors, solid oxide fuel cells, solid electrolytes, magnetic storage devices, etc. In a paraelectric crystal structure, perovskite-type materials can have a dielectric constant (K) greater than 200, for example, $Ba_xSr_{1-x}TiO_3$, and can be very useful for dynamic random access memory (DRAM). In a ferroelectric crystal structure, perovskite-type material can have K greater than 1000, for example, $PbTiO_3$, $PbZrO_3$, $PbZr_yTi_{1-y}O_3$, and $SrBi_2Ta_2O_9$, and may be useful for non-volatile field effect transistor (FET) memory.

According to one aspect of the invention, a method includes forming a material over a substrate, oxidizing the material, and converting at least a portion of the oxidized material to a perovskite-type crystalline structure. The material can have a composition which, when fully oxidized, provides the composition of a perovskite-type material that can be converted to the perovskite-type crystalline structure. Forming the material can include depositing the material in a vacuum chamber at less than atmospheric pressure. Other methods known to those skilled in the art may also be suitable.

A variety of methods have been attempted for forming perovskite-type materials. Oxidation of multi-layered pure metal (e.g., Nb/Ta) can be used to form multi-layered dielectric oxides. However, such methods have not been used as precursor steps to producing a perovskite-type material. The oxidation process is facilitated by the similarity of the metals converted to oxides. Oxidation of metal films to form perovskite-type material is more complex both thermodynamically and kinetically. A metal alloy can be oxidized to form a perovskite-type composition. Additional processing allows formation of the desired crystal structure. Merely oxidizing the alloy produces an amorphous structure of limited technological value given the much lower dielectric constant compared to a perovskite-type crystalline structure.

One difficulty in forming perovskite-type material is that at least two of the metals in a material to be converted can exhibit a substantial difference in chemical affinity for oxygen. A difference in chemical affinity can result in preferential oxidation of one metal in comparison to another metal. Diffusion of one of the metals in the material often enables the preferential oxidation. Accordingly, a material beginning as an alloy of at least two metals subject to preferential oxidation and related diffusion can acquire a morphology difficult to convert to a perovskite-type crystalline structure.

Differences in chemical affinities can be very large, as typified by the perovskite-type material $PbTiO_3$. Pb is a relatively inert metal with limited affinity for oxygen. Ti is highly reactive and has an affinity for oxygen exceeding that of Pb by many tens of orders of magnitude. In the context of the present document, "substantial difference" in chemical affinity refers to a difference sufficient to produce preferential oxidation of components in a material, such as an alloy, and/or interdiffusion of components in the material.

Perovskite-type material can also contain metals that exhibit a substantial difference in chemical affinity for other non-metals, especially nitrogen and carbon. Reaction with nitrogen and carbon can form impurities difficult to remove from a material intended for perovskite-type crystalline structure and impact physical and chemical characteristics potentially available in more pure perovskite-type material. Reaction with nitrogen and carbon can also produce diffusion in manner similar to that described for oxidation. As an example, Pb does not form stable nitrides or carbides, but Ti forms exceedingly stable nitrides and carbides. Cu, Ni, and Co can be found in some perovskite-type material and have limited affinities for oxygen and relatively no affinity for nitrogen and carbon. Transition elements such as Zr, Fe, Mn, Cr, V, and Ta can be present in perovskite-type material and are more reactive with nitrogen and carbon. Alkaline earth metals and lanthanide metals can be frequently found in perovskite-type material and are extremely reactive with oxygen, nitrogen, and carbon.

Perovskite-type material can contain metals that do not exhibit a substantial difference in chemical affinities. For example, $SrBi_2Ta_2$ may be oxidized to form a perovskite-type composition and the elements are similar in their reactivities with oxygen. Yet, a desire may exist to retard diffusion of elements in the alloy that could create difficulty in conversion to a perovskite-type crystalline structure. Accordingly, the aspects of the present invention can be advantageous even when no substantial difference exists in chemical affinity.

One method of forming a perovskite-type material includes forming a material over a substrate and heating the material in an oxidizing atmosphere, thereby simultaneously oxidizing and crystallizing the material into a perovskite-type material. However, as discussed above, preferential oxidation and/or diffusion of metals in the material might interfere with formation of perovskite-type crystalline structure. Accordingly, one aspect of the invention can include oxidizing the material and, separately from the oxidizing, converting at least a portion of the oxidized material to a perovskite-type crystalline structure. Oxidizing the material separately from conversion to a crystalline structure allows for retarding interdiffusion of metals in the material.

A variety of methods can be effective in retarding interdiffusion. One example includes oxidizing at least an outer portion of material. In an alloy material including at least two metals, oxidizing at least an outer portion of the alloy material can be used to decorate grain boundaries in the alloy with oxygen. The greater strength of metal-oxygen bonds relative to metal-metal bonds is known to produce large increases in melting points of some metals upon oxidizing such metals. For similar reasons, oxidizing at least an outer portion of a material can be used to retard interdiffusion of the metals in the material. Implanting oxygen ions into an outer portion of the material can also be used alone or in combination with the described oxidizing to retard interdiffusion.

One example of oxidizing the outer portion includes exposure to an oxygen plasma. Implanting of oxygen ions can occur simultaneous with the exposure to the oxygen plasma. An oxygen plasma can contain a number of species including neutral oxygen atoms as well and singly- and doubly-charged ions and molecules. The relative concentrations of such species can be varied over wide ranges by changing the plasma-generating conditions, geometry and grounding of a plasma processing chamber. Using the knowledge of those skilled in the art, process parameters can be adjusted to yield an adequately controlled oxidation process in accordance with the aspects of the invention described herein. One effective example includes forming a plasma by applying an AC voltage across a deposition substrate and a counter electrode while flowing oxygen into a vacuum chamber held at a pressure of about 2 to about 50 microns of Hg. A triode arrangement may also be useful in producing an oxygen plasma with suitable oxidation properties.

Implanting of oxygen ions can also occur from a source other than an oxygen plasma. A low energy ion beam can provide a flux of a desired ionic oxygen species. An alternative oxidation method includes using an ozone source to provide oxygen neutrals. The ozone may decompose to form molecular and nascent or atomic oxygen. Atomic oxygen is very small compared to molecular oxygen and can diffuse more rapidly through a growing oxide surface layer to reach unreacted material beneath, forming an oxide at an enhanced, but quite controllable, rate. As examples, silicon and lead can significantly oxidize at relatively low temperatures in ozone.

The specific thickness of the outer portion oxidized to retard interdiffusion and/or implanted with oxygen ions will depend on a variety of factors. Greater differences between metals in chemical affinity for oxygen, higher process temperatures used to convert to the perovskite-type crystalline structure, greater thicknesses of the overall material, etc. might motivate a desire for increased thickness of the outer portion to retard interdiffusion. Typically, exposure to an oxygen plasma and/or implanting oxygen ions can occur at temperatures sufficiently low that interdiffusion of metals in the material is not of significant concern. Concern becomes significant when interdiffusion reaches a level hampering the ability to obtain stoichiometric perovskite-type crystalline structures.

Additional oxidation of the material after retarding interdiffusion may be desirable to increase the amount of material that can be converted to a perovskite-type crystalline structure. Accordingly, oxidizing the material described above can include oxidizing only a first portion of the material and the method can further include, separately from the converting, oxidizing a second portion of the material beneath the first portion. Further, another aspect of the invention includes forming an alloy material containing at least two metals over a substrate and retarding interdiffusion of the at least two metals. The method can additionally include oxidizing the alloy material after the retarding interdiffusion. The alloy film can be annealed prior to oxidation in order to change the initial film morphology and stress if desired. At least a portion of the oxidized alloy material can be converted to a perovskite-type crystalline structure.

As described herein, reaction with carbon and nitrogen can produce carbide and nitride impurities that interfere with perovskite conversion. One option to prevent carbon and nitrogen incorporation includes performing each part of the method in situ, that is, in the same process chamber. Alternatively, the various aspects of the method can occur in a processing device having one or more chambers that may be used to complete the method without exposure to ambient conditions. For example, forming the material can occur in the processing device and the oxidizing can include substantially complete oxidation of the material also in the processing device prior to removal from the processing device. "Substantially complete" oxidation refers to providing a sufficient amount of oxygen to achieve a desired perovskite-type crystalline structure. Such could be accomplished by oxidizing the outer portion and implanting oxygen ions in situ with the forming the material. Next, an inner portion of the material can be oxidized either in situ or in a chamber of the processing device without ambient exposure to substantially complete oxidation of the material. Also, oxidizing and implanting could occur in a different chamber of the processing device than the forming the material, but without ambient exposure. Notably, the aspects of the invention described herein with a variety of oxidation options provides simple mechanisms for fine tuning material compositions to achieve suitable stoichiometry prior to perovskite conversion.

The oxidizing the material and converting the material can occur in different process chambers. The different process chambers might be comprised by a multi-chamber processing device. Also, the oxidizing might include substantially complete oxidation, reducing a concern for nitride or carbide formation. However, the method can instead or further include forming a passivation layer to carbon and nitrogen over the material. Oxides of amorphous silicon, aluminum, or alloys thereof are suitable examples of passivation materials, although other suitable materials likely exist. A passivation material might be deposited in a primarily unoxidized state with a sufficient amount of oxidation occurring as a result of ambient oxygen exposure to accomplish sufficient passivation. After passivation, the underlying material, perhaps partially oxidized material, can be ambient exposed without significant concern for nitride or carbide formation. Substantially complete oxidation can occur later after forming the passivation layer. As one example, forming the passivation layer can occur in situ with forming the material over the substrate and/or in situ with oxidizing the material incompletely or substantially completely.

A possibility exists that components of a passivation layer might diffuse into underlying material during subsequent higher temperature processing. An extremely thin film can be used as a passivation layer to prevent reaction with impurities during ambient exposure. Thickness is preferably from about 0.5 to about 2 nanometers (nm) but can be higher. Accordingly, oxidizing a passivation film to retard diffusion into underlying material might be easily done. Such oxidation can occur at less than about 200 C. One example includes using a microwave discharge of an oxygen plasma to quickly oxidize the extremely thin film. Other oxidization methods may be additionally suitable.

The method can further include oxidizing a second portion of the material after oxidizing the passivation layer. Oxidizing the second portion can accomplish substantially complete oxidation of the material. Also, oxidizing the second portion can occur in situ with oxidizing the passivation layer. Appropriate oxidized materials described above can be converted to a perovskite-type crystalline structure by heating. The heating can occur in situ, in a multi-chamber processing device, or in a separate chamber after ambient exposure. Preferably, providing a passivation layer precedes ambient exposure. Heating can include reaching a maximum temperature no more than about one-half of a melting point temperature of the perovskite-type material. Preferably, heating includes reaching a maximum temperature of no more than about one-third of the melting point temperature.

The various oxidations described above can generally be accomplished at temperatures of less than about 600 C., especially when using a microwave discharge of an oxygen plasma. The lower temperature oxidations minimize degradation of integrated circuit components that might exist in association with the perovskite-type material. Subsequent perovskite conversion can typically occur at about 700 C. or in keeping with melting point temperatures often associated with perovskite-type material. Conversion can occur by controlling temperature at 700 C., or another suitable temperature, for an entirety of a selected duration. Also, conversion can occur by using various heating and cooling steps to control thermal budget. Some perovskite-type materials might convert at temperatures less than 700 C. Also, conversion of only a portion of the oxidized material might be suitable to obtain the desired material.

Conversion of the oxidized material to a perovskite-type crystalline structure can occur in an atmosphere purged of oxygen. Purging of oxygen can occur in keeping with the knowledge of those of ordinary skill in the art. Since the conversion can occur at higher temperatures than oxidation, purging oxygen aids in preventing oxidation of integrated circuit components, particularly those containing silicon, that might be associated with the perovskite-type material. However, molecular oxygen can be added during conversion rather than using a purged chamber to fine tune stoichiometry.

In one application, the substrate can include a capacitor electrode and the converted, oxidized material can include a capacitor dielectric layer. The substrate might also include a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A suitable dielectric layer might be obtained with only partial conversion to a perovskite-type crystalline structure. Potentially, the crystallized perovskite can be in a monocrystalline form, but is more likely microcrystalline.

In a circumstance where a passivation layer is formed and oxidized, the passivation layer can provide an additional capacitor dielectric layer. A passivation layer oxidized to $SiO_2$ or $Al_2O_3$ might slightly reduce the overall storage capacity of a capacitor given a likely lower dielectric constant. However, given the extremely high K of the perovskite-type material, the slight effect of the additional dielectric may be acceptable. Further, given the different chemical and physical characteristics of the underlying perovskite-type material, the oxidized passivation layer might reduce defect densities for the double dielectric. If desired, the passivation layer or oxidized passivation layer can be removed at an appropriate point in processing. Selective reactive ion etching might easily remove $SiO_2$ in preference to a typical underlying perovskite-type material.

According to one aspect of the invention, a capacitor dielectric forming method includes forming an alloy layer comprising at least two metals over a capacitor electrode, oxidizing the alloy layer, and converting the alloy layer to form a capacitor dielectric layer comprising a perovskite-type crystalline structure. Having the metals in solid solution as an alloy and maintain the metal distribution throughout oxidation can facilitate later conversion to substantially stoichiometric perovskite-type crystalline structure. The various methods described above are accordingly applicable to converting an alloy layer.

Figure 1:
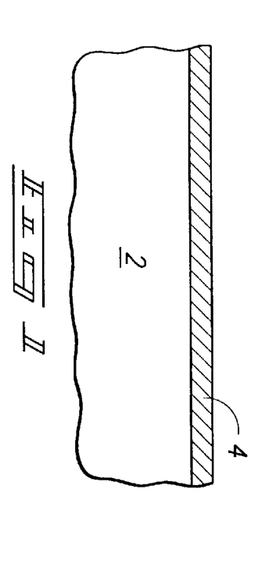
FIG. 1 shows a cross sectional view of a substrate fragment at a processing step according to an aspect of the invention.

FIG. 1 shows an inner electrode 4 formed over a substrate 2. Even though electrode 4 is shown as planar, the capacitor dielectrics discussed herein can be adapted to any variety of capacitor structures. Inner electrode 4 can include metals such as Ru, Ir, and Pt as well as their conductive oxides, highly doped silicon, and additional materials considered suitable by those of ordinary skill.

Figure 2:
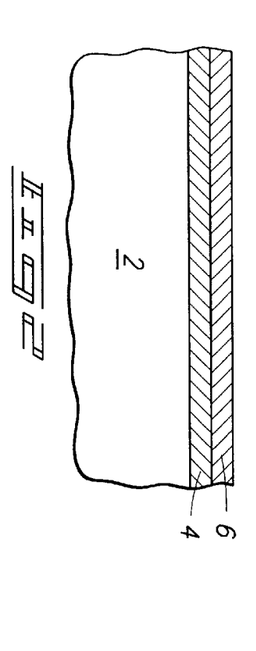
FIG. 2 shows the substrate fragment of FIG. 1 at a processing step subsequent to that shown in FIG. 1.
Figure 3:
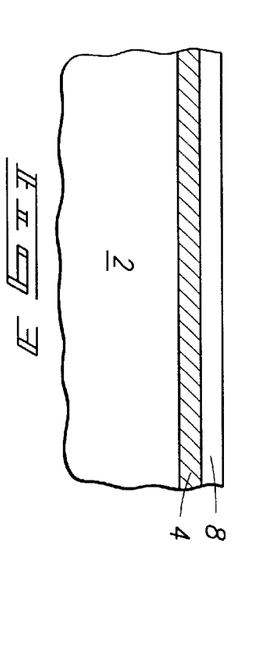
FIG. 3 shows the substrate fragment of FIG. 2 at a processing step subsequent to that shown in FIG. 2.

FIG. 2 shows an alloy 6 containing at least two metals formed over inner electrode 4. Alloy 6 can be oxidized and converted to a perovskite-type crystalline structure providing a dielectric 8 as shown in FIG. 3. Alloy 6 can be formed having a thickness of from about 1 nm to about 500 nm, but preferably from about 3 to about 30 nm. Depending on the particular metals selected for the alloy and the target perovskite composition, the thickness of alloy 6 can increase during oxidation. About 50% growth is often expected though not shown in the Figures. Since thin dielectric layers are often preferred, dielectric 8 can have a thickness less than about 100 Angstroms, but preferably less than about 50 Angstroms assuming sufficient dielectric properties. Alloy 6 can be formed by a variety of methods including physical vapor deposition, sputtering, etc. from a single source or multiple sources.

Figure 4:
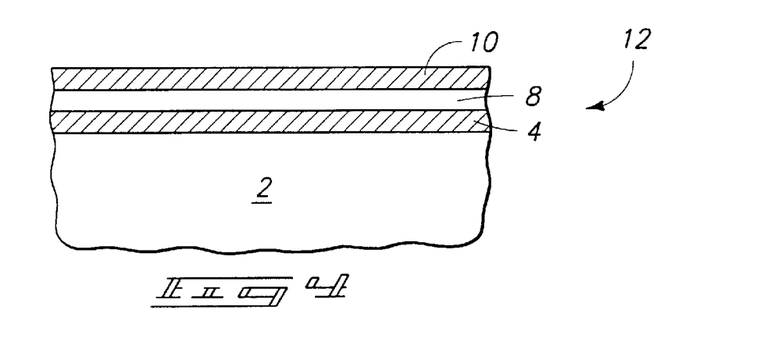
FIG. 4 shows the substrate fragment of FIG. 3 at a processing step subsequent to that shown in FIG. 3.

FIG. 4 shows an outer electrode 10 formed over dielectric 8 providing a capacitor construction 12. Although not shown in FIG. 4, a variety of additional layers can be formed between one or more of substrate 2 and the various layers shown. The purpose of additional layers might be to improve on the basic capacitor construction 12 in accordance with the knowledge of those skilled in the art.

Figure 5:
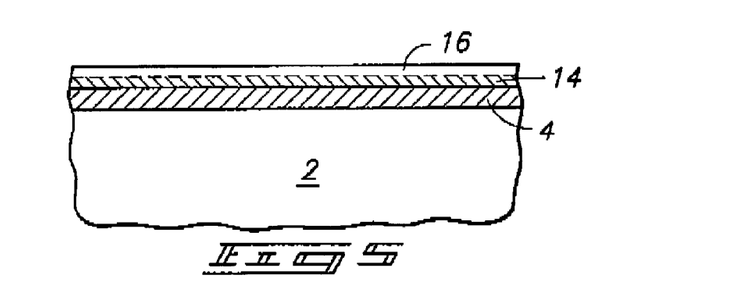
FIG. 5 shows the substrate fragment of FIG. 2 at a processing step subsequent to that shown in FIG. 2 according to an alternative aspect of the invention.

FIG. 5 shows alternate processing subsequent to that shown in FIG. 2 wherein outer portion 16 of alloy 6 is oxidized but inner portion 14 remains largely as shown in FIG. 2. Outer portion 16 can have a thickness of from about 0.5 to about 2 nm and sufficiently retard interdiffusion in an alloy film of about 3 to about 30 nm. However, in keeping with principles described herein, outer portion 16 might be more thick.

Figure 6:
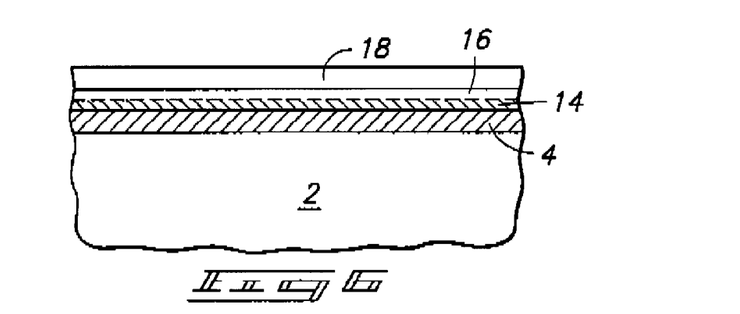
FIG. 6 shows the substrate fragment of FIG. 5 at a processing step subsequent to that shown in FIG. 5.

FIG. 6 shows passivation 18 formed over outer portion 16 to reduce material degradation during ambient exposure. Passivation 18 can even allow storage of the construction shown in FIG. 6 under low relative humidity conditions for further processing at a later time. Notably, passivation 18 is shown without hatching indicating a non-metallic material. However, passivation 18 can be a metallic material, such as Al, or a non-metal, such as Si. In the context of the present document, "metals" refers to the elements of Groups IA, IIA, and IB to VIIIB of the periodic table of the elements along with the portions of Groups IIIA to VIA designated as metals in the periodic table, namely, Al, Ga, In, Tl, Ge, Sn, Pb, Sb, Bi, and Po. "Non-metals" refers to the remaining elements of the periodic table.

Figure 7:
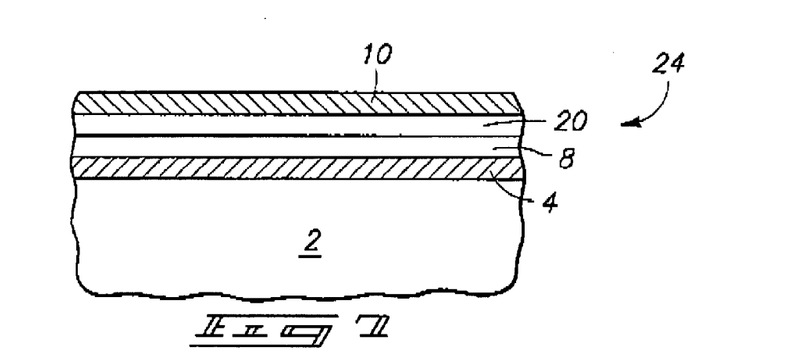
FIG. 7 shows the substrate fragment of FIG. 6 at a processing step subsequent to that shown in FIG. 6.

FIG. 7 shows passivation 18 oxidized to an outer dielectric 20 and inner portion 14 along with outer portion 16 oxidized and converted to dielectric 8 having a perovskite-type crystalline structure. An outer electrode 10 is formed over outer dielectric 20 to produce a capacitor construction 24.

According to another aspect of the invention, a capacitor dielectric forming method includes vacuum depositing an alloy layer containing at least two metals exhibiting a substantial difference in chemical affinity for oxygen. The vacuum depositing can occur over a capacitor electrode in a processing device having one or more chambers. The method includes oxidizing a first portion of the deposited alloy layer with an oxygen plasma and implanting oxygen ions into the deposited alloy layer. The oxidizing and implanting can occur at a first temperature in the processing device after the vacuum depositing, but before removal of from the processing device. The method also includes oxidizing a second portion of the deposited alloy layer. The method further includes separately from oxidizing the first and second portions, heating the oxidized alloy layer and converting at least a portion of the oxidized alloy layer to a perovskite-type crystalline structure to form a capacitor dielectric layer. During conversion, a second temperature can be reached greater than the first temperature but no more than about one-half of a melting point temperature of the layer portion having the perovskite-type structure. As an option, the method may further include vacuum depositing a passivation layer to carbon and nitrogen reaction over the alloy layer. The passivation layer can be oxidized to an additional dielectric layer before oxidizing the second portion of the deposited alloy layer. Additionally, oxidizing the second portion can occur in situ with oxidizing the passivation layer.

Figure 8:
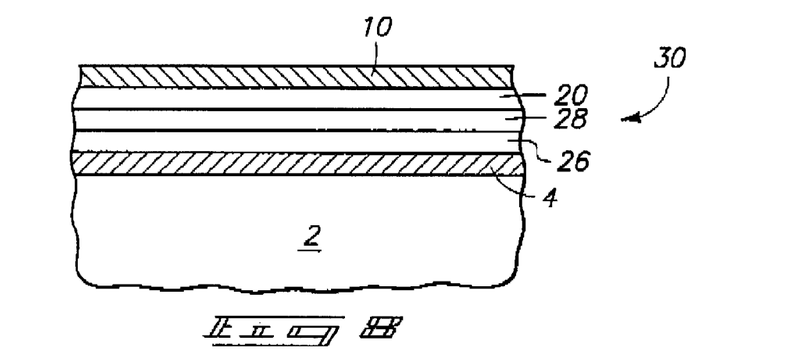
FIG. 8 shows a cross sectional view of a substrate fragment according to an alternative aspect of the invention.

The methods described herein are not limited to formation of a single layer having a perovskite-type crystalline structure or a single composition for the perovskite-type crystalline structure. Different starting materials can be provided or different oxidation processing can occur to yield multiple layers of perovskite-type material having the same or different composition. Accordingly, a capacitor dielectric forming method includes forming a first alloy layer containing at least two metals over a capacitor electrode and forming a second alloy layer comprising at least two metals over the first alloy layer. The method includes oxidizing the first alloy layer and oxidizing the second alloy layer. The method also includes processing the first alloy layer to form a first capacitor dielectric layer having a perovskite-type crystalline structure and processing the second alloy layer to form a second capacitor dielectric layer having a perovskite-layer crystalline structure. The method may include completion of processing the first alloy layer before forming the second alloy layer. The method may instead include oxidizing the first and second alloy layers together. The method can further include processing the first and second alloy layers together. Accordingly, FIG. 8 shows a capacitor construction 30 where dielectric 8 is replaced by a first dielectric 26 and a second dielectric 28. Outer dielectric 20 such as shown in FIG. 7 is over first and second dielectrics 26, 28.

As indicated herein, the aspects of the invention are extendable to forming other than perovskite-type materials. Specifically, a capacitor dielectric forming method can include vacuum depositing an alloy layer containing at least two metals exhibiting a substantial difference in chemical affinity for oxygen. The vacuum depositing can occur over a capacitor electrode. The method includes oxidizing substantially all of the deposited alloy layer using at least an oxygen plasma and implantation of oxygen ions into the deposited alloy layer. The oxidizing and the implanting can occur at a first temperature in situ with the depositing. The method further includes, separately from the oxidizing, heating the oxidized alloy layer and converting substantially all of the oxidized alloy layer to a crystalline structure to form a capacitor dielectric layer. A second temperature can be reached greater than the first temperature at about one-third of a melting point temperature of the layer having the crystalline structure.

A further alternative aspect of the invention provides a capacitor dielectric forming method including vacuum depositing as described in the immediately preceding paragraph. The method includes oxidizing a first portion of the deposited alloy layer with an oxygen plasma and implanting oxygen ions into the deposited alloy layer. A passivation layer can be vacuum deposited over the oxidized alloy layer in situ with oxidizing the first portion. The passivation layer can be oxidized to form an outer capacitor dielectric layer. A second portion of the deposited alloy layer can be oxidized in situ with oxidizing the passivation layer. Separately from oxidizing the first and second portions, the oxidized alloy layer can be heated and converted, at least in part, to a crystalline structure to form an inner capacitor dielectric layer.

A variety of capacitor constructions can result from the various methods according to the aspects of the invention herein. Accordingly, one aspect provides a capacitor construction including an inner electrode, an inner dielectric layer over the inner electrode, an outer dielectric layer over the inner dielectric layer, and an outer electrode over the outer dielectric layer. The inner dielectric layer can include an oxidized alloy of at least two metals in a perovskite-type crystalline structure. The outer dielectric layer can include an oxide of a material wherein the material exhibits passivation against carbon and nitrogen reaction. The capacitor construction can further include a middle dielectric layer between the inner and outer dielectric layers. The middle dielectric layer can include an oxidized alloy of at least two metals in a perovskite-type crystalline structure.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method comprising:
   forming a material over a substrate;
   oxidizing at least an outer portion of the material and implanting oxygen ions into the outer portion, the oxidizing the outer portion and implanting occurring in situ with the forming the material; and
   separately from the oxidizing, converting at least a portion of the oxidized material to a perovskite-type crystalline structure.

2. The method of claim 1 wherein the substrate comprises a capacitor electrode and the converted, oxidized material comprises a capacitor dielectric layer.

3. The method of claim 1 wherein the substrate comprises a semiconductor wafer.

4. The method of claim 1 wherein the material comprises an alloy of at least two metals.

5. The method of claim 4 wherein at least two of the metals exhibit a substantial difference in chemical affinity for oxygen.

6. The method of claim 1 wherein the forming the material comprises depositing the material in a vacuum chamber at less than atmospheric pressure.

7. The method of claim 1 wherein the oxidizing and the converting occur in different process chambers.

8. The method of claim 1 wherein the forming the material occurs in a processing device comprising one or more chambers and the oxidizing comprises substantially complete oxidation of the material also in the processing device prior to removal from the processing device.

9. The method of claim 1 wherein the oxidizing the outer portion comprises exposure to an oxygen plasma.

10. The method of claim 1 wherein the oxidizing the material comprises oxidizing only a first portion of the material and the method further comprises, separately from the converting, oxidizing a second portion of the material beneath the first portion.

11. The method of claim 10 wherein the oxidizing only the first portion occurs in situ with the forming the material.

12. A method comprising:
   forming a material over a substrate;
   forming a passivation layer to carbon and nitrogen over the material;
   oxidizing the material; and
   separately from the oxidizing, converting at least a portion of the oxidized material to a perovskite-type crystalline structure.

13. The method of claim 12 wherein the oxidizing the material comprises oxidizing only a first portion of the material, the forming the passivation layer occurs in situ with the forming the material, and the method further comprises oxidizing the passivation layer and thereafter oxidizing a second portion of the material in situ with the oxidizing the passivation layer.

14. The method of claim 1 wherein the converting comprises heating the oxidized material and reaching a maximum temperature no more than about one-half of a melting point temperature of the perovskite-type material.

15. The method of claim 1 further comprising converting an additional oxidized material to a perovskite-type crystalline structure.

16. A method comprising:
forming an alloy material comprising at least two metals over a substrate;
retarding interdiffusion of the at least two metals;
oxidizing the alloy material after the retarding interdiffusion; and
converting at least a portion of the oxidized alloy material to a perovskite-type crystalline structure.

17. The method of claim 16 wherein the substrate comprises a capacitor electrode and the converted, oxidized alloy material comprises a capacitor dielectric layer.

18. The method of claim 16 wherein the oxidizing and the converting occur in different process chambers.

19. The method of claim 16 wherein the forming the alloy material occurs in a processing device comprising one or more chambers and the retarding interdiffusion and the oxidizing together comprise substantially complete oxidation of the material also in the processing device prior to removal from the processing device.

20. The method of claim 16 wherein the retarding interdiffusion comprises oxidizing at least an outer portion of the alloy material and implanting oxygen ions into the outer portion, the oxidizing the outer portion and implanting occurring in situ with the forming an alloy material.

21. The method of claim 20 wherein the oxidizing the alloy material after the retarding interdiffusion comprises oxidizing an inner portion of the alloy material and such oxidizing occurs separately from the converting.

22. The method of claim 16 wherein the retarding interdiffusion occurs in situ with the forming the alloy material.

23. The method of claim 16 further comprising forming a passivation layer to carbon and nitrogen reaction over the alloy material, the oxidizing occurring after the forming the passivation layer.

24. The method of claim 23 wherein the forming the passivation layer occurs in situ with the forming the alloy material and the method further comprises oxidizing the passivation layer, the oxidizing the alloy material occurring in situ with the oxidizing the passivation layer.

25. The method of claim 16 wherein the converting comprises heating the oxidized alloy material and reaching a maximum temperature no more than about one-half of a melting point temperature of the oxidized alloy material having a perovskite-type crystalline structure.

26. The method of claim 16 further comprising converting an additional oxidized alloy material to a perovskite-type crystalline structure.

27. A capacitor dielectric forming method comprising:
forming an alloy layer comprising at least two metals over a capacitor electrode;
oxidizing metal in the alloy layer; and
converting the alloy layer to form a capacitor dielectric layer comprising a perovskite-type crystalline structure.

28. The method of claim 27 wherein at least two of the metals exhibit a substantial difference in chemical affinity for oxygen.

29. The method of claim 27 wherein the oxidizing and the converting occur in different process chambers.

30. The method of claim 27 wherein the forming the alloy layer occurs in a processing device comprising one or more chambers and the oxidizing comprises substantially complete oxidation of the alloy layer also in the processing device prior to removal from the processing device.

31. A capacitor dielectric forming method comprising:
forming an alloy layer comprising at least two metals over a capacitor electrode;
oxidizing at least an outer portion of the alloy layer and implanting oxygen ions into the outer portion, the oxidizing the outer portion and the implanting retarding interdiffusion of the metals; and
converting the alloy layer to form a capacitor dielectric layer comprising a perovskite-type crystalline structure.

32. The method of claim 27 wherein the oxidizing comprises oxidizing only a first portion of the alloy layer and the method further comprises, separately from the converting, oxidizing a second portion of the alloy layer beneath the first portion.

33. The method of claim 27 further comprising forming a passivation layer to carbon and nitrogen over the alloy layer.

34. The method of claim 27 wherein the converting comprises heating the oxidized alloy layer and reaching a maximum temperature no more than about one-half of a melting point temperature of the perovskite-type alloy layer.

35. The method of claim 27 further comprising converting an additional alloy layer to form an additional capacitor dielectric layer comprising a perovskite-type crystalline structure.

36. A capacitor dielectric forming method comprising:
vacuum depositing an alloy layer comprising at least two metals exhibiting a substantial difference in chemical affinity for oxygen, the vacuum depositing occurring over a capacitor electrode in a processing device comprising one or more chambers;
oxidizing a first portion of the deposited alloy layer with an oxygen plasma and implanting oxygen ions into the deposited alloy layer, the oxidizing and the implanting occurring at a first temperature in the processing device after the vacuum depositing but before removal from the processing device;
oxidizing a second portion of the deposited alloy layer; and
separately from the oxidizing the first and second portions, heating the oxidized alloy layer, converting at least a portion of the oxidized alloy layer to a perovskite-type crystalline structure to form a capacitor dielectric layer, and reaching a second temperature greater than the first temperature but no more than about one-half of a melting point temperature of the layer portion having the perovskite-type structure.

37. The method of claim 36 wherein the oxidizing the first portion occurs in situ with the depositing.

38. The method of claim 36 wherein the oxidizing the first and second portions occurs together.

39. The method of claim 36 further comprising vacuum depositing a passivation layer to carbon and nitrogen reaction over the alloy layer and oxidizing the passivation layer to an additional dielectric layer before the oxidizing the second portion of the deposited alloy layer.

40. The method of claim 39 wherein the depositing the passivation layer occurs in the processing device after the oxidizing the first portion but before removal from the processing device.

41. The method of claim 39 wherein the oxidizing the second portion occurs in situ with the oxidizing the passivation layer.

42. The method of claim 36 wherein the second portion is oxidized at a third temperature between the first temperature and the second temperature.

43. The method of claim 36 further comprising converting at least a portion of an additional oxidized alloy layer to a perovskite-type crystalline structure to form an additional capacitor dielectric layer.

44. A capacitor dielectric forming method comprising:
   forming a first alloy layer comprising at least two metals over a capacitor electrode;
   forming a second alloy layer comprising at least two metals over the first alloy layer;
   oxidizing metal in the first alloy layer;
   oxidizing metal in the second alloy layer,
   processing the first alloy layer to form a first capacitor dielectric layer comprising a perovskite-type crystalline structure; and
   processing the second alloy layer to form a second capacitor dielectric layer comprising a perovskite-type crystalline structure.

45. The method of claim 44 comprising completing the processing the first alloy layer before the forming second alloy layer.

46. The method of claim 44 comprising oxidizing the first and second alloy layers together.

47. The method of claim 44 comprising processing the first and second alloy layers together.

48. A capacitor dielectric forming method comprising:
   vacuum depositing an alloy layer comprising at least two metals exhibiting a substantial difference in chemical affinity for oxygen, the vacuum depositing occurring over a capacitor electrode;
   oxidizing substantially all of the deposited alloy layer using at least an oxygen plasma and implantation of oxygen ions into the deposited alloy layer, the oxidizing and the implanting occurring at a first temperature in situ with the depositing; and
   separately from the oxidizing, heating the oxidized alloy layer, converting substantially all of the oxidized alloy layer to a crystalline structure to form a capacitor dielectric layer, and reaching a second temperature greater than the first temperature and about one-third of a melting point temperature of the layer having the crystalline structure.

49. A capacitor dielectric forming method comprising:
   vacuum depositing an alloy layer comprising at least two metals exhibiting a substantial difference in chemical affinity for oxygen, the vacuum depositing occurring over a capacitor electrode;
   oxidizing a first portion of the deposited alloy layer with an oxygen plasma and implanting oxygen ions into the deposited alloy layer, the oxidizing and the implanting occurring at a first temperature and in situ with the depositing the alloy layer;
   vacuum depositing a passivation layer to carbon and nitrogen reaction over the oxidized alloy layer in situ with the oxidizing the first portion;
   oxidizing the passivation layer to form an outer capacitor dielectric layer;
   oxidizing a second portion of the deposited alloy layer in situ with the oxidizing the passivation layer;
   separately from the oxidizing the first and second portions, heating the oxidized alloy layer, converting at least a portion of the oxidized alloy layer to a crystalline structure to form an inner capacitor dielectric layer, and reaching a second temperature greater than the first temperature and about one-third of a melting point temperature of the layer having the crystalline structure.

* * * * *

UNITED STATES PATENT AND TRADEMARK OFFICE
CERTIFICATE OF CORRECTION

PATENT NO. : 6,730,575 B2
DATED : August 30, 2001
INVENTOR(S) : Jerome M. Eldridge It is certified that error appears in the above-identified patent and that said Letters Patent is hereby corrected as shown below:

Title page,
Item [56], References Cited, U.S. PATENT DOCUMENTS, replace
"5,789,267   A   *   8/1998   Hsia et al. ...............438/240" with
-- 5,789,268 A   *   8/1998   Chivukula et al. ........437/60 --.
OTHER PUBLICATIONS,
replace "K.S. Tang, W.S. Lau, and G.S. Samudra, "Trends in Dram Dielectrics", IEEE Circuits & Devices, vol. 13, No. 3, May 1997, pp. 27-34." with
-- K.S. Tang, W.S. Lau, and G.S. Samudra, "Trends in DRAM Dielectrics", IEEE Circuits & Devices, vol. 13, No. 3, May 1997, pp. 27-34." --.
"D.W. Hess" reference, replace "chemistry", Pergamon Press, 1958, pp. 226-227 and 336-337" with -- O. Kubaschewshi, E. L.L. Evans, "Metallurgical Thermochemistry", Pergamon Press, 1958, pp. 226-227 and 336-337 --.

Column 4,
Line 49, replace "including neutral oxygen atoms as well and singly- and" with
-- including neutral oxygen atoms as well as singly- and --.

Column 8,
Line 33, replace "metals in the periodic table, namely, Al, Ga, In, TI, Ge, Sn," with
-- metals in the periodic table, namely, Al, Ga, In, Tl, Ge, Sn, --.

Signed and Sealed this

Twenty-first Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 6,730,575 B2
DATED : May 4, 2004
INVENTOR(S) : Jerome M. Eldridge

Page 1 of 1

It is certified that error appears in the above-identified patent and that said Letters Patent is hereby corrected as shown below:

Title page,
Item [56], References Cited, U.S. PATENT DOCUMENTS, replace
"5,789,267   A   *   8/1998   Hsia et al.            438/240" with
-- 5,789,268 A   *   8/1998   Chivukula et al.   437/60 --.
OTHER PUBLICATIONS,
replace "K.S. Tang, W.S. Lau, and G.S. Samudra, "Trends in Dram Dielectrics", IEEE Circuits & Devices, vol. 13, No. 3, May 1997, pp. 27-34." with
-- K.S. Tang, W.S. Lau, and G.S. Samudra, "Trends in DRAM Dielectrics", IEEE Circuits & Devices, vol. 13, No. 3, May 1997, pp. 27-34." --.
"D.W. Hess" reference, replace "chemistry", Pergamon Press, 1958, pp. 226-227 and 336-337" with -- O. Kubaschewshi, E. L.L. Evans, "Metallurgical Thermochemistry", Pergamon Press, 1958, pp. 226-227 and 336-337 --.

Column 4,
Line 49, replace "including neutral oxygen atoms as well and singly- and" with
-- including neutral oxygen atoms as well as singly- and --.

Column 8,
Line 33, replace "metals in the periodic table, namely, Al, Ga, In, TI, Ge, Sn," with
-- metals in the periodic table, namely, Al, Ga, In, Tl, Ge, Sn, --.

This certificate supersedes Certificate of Correction issued February 21, 2006.

Signed and Sealed this

Ninth Day of May, 2006

JON W. DUDAS
*Director of the United States Patent and Trademark Office*